United States Patent [19]

Sorna et al.

[11] Patent Number: 5,144,228
[45] Date of Patent: Sep. 1, 1992

[54] PROBE INTERFACE ASSEMBLY

[75] Inventors: Michael A. Sorna, Poughkeepsie; Donald J. Papae, Hopewell Junction, both of N.Y.

[73] Assignee: International Business Machines Corporation, Armonk, N.Y.

[21] Appl. No.: 690,404

[22] Filed: Apr. 23, 1991

[51] Int. Cl.$^5$ .................. G01R 1/00; G01R 1/02
[52] U.S. Cl. .................. 324/158 P; 324/158 F; 324/72.5; 357/68
[58] Field of Search ........... 324/158 F, 158 P, 22.5, 324/73.1; 333/238, 246, 247; 174/260–262; 361/111; 357/68, 70, 71

[56] References Cited

U.S. PATENT DOCUMENTS

| | | | |
|---|---|---|---|
| 3,963,986 | 6/1976 | Morton et al. | 324/158 F |
| 4,473,798 | 9/1984 | Credone et al. | 324/158 |
| 4,544,888 | 10/1985 | Kvaternik | 324/158 |
| 4,567,432 | 1/1986 | Buol et al. | 324/158 |
| 4,574,235 | 3/1986 | Kelly et al. | 324/158 F |
| 4,574,236 | 3/1986 | Hechtman | 324/158 F |
| 4,668,041 | 5/1987 | LaKomski | 339/147 R |
| 4,672,312 | 6/1987 | Takemine | 324/158 F |
| 4,683,425 | 7/1987 | Tossutto | 324/158 F |
| 4,712,161 | 12/1987 | Pryor et al. | 361/411 |
| 4,713,494 | 12/1987 | Oikawa et al. | 174/68.5 |
| 4,719,417 | 7/1988 | Evans | 324/158 P |
| 4,727,319 | 2/1988 | Shahriary | 324/158 P |
| 4,731,577 | 3/1988 | Logan | 324/158 F |
| 4,764,723 | 8/1988 | Strid | 324/158 P |
| 4,771,236 | 9/1988 | Banks | 324/158 F |
| 4,779,047 | 10/1988 | Solstad et al. | 324/158 F |
| 4,791,363 | 12/1988 | Logan | 324/158 P |
| 4,825,155 | 4/1989 | Takamine | 324/158 P |
| 4,858,077 | 8/1989 | Shinohara et al. | 174/260 |
| 4,866,507 | 9/1989 | Jacobs et al. | 357/74 |
| 4,928,061 | 5/1990 | Dampier et al. | 324/158 F |
| 4,933,743 | 6/1990 | Thomas et al. | 357/71 |
| 4,994,735 | 2/1991 | Leedy | 324/158 P |
| 5,028,983 | 7/1991 | Bickford et al. | 357/68 |

FOREIGN PATENT DOCUMENTS

| | | |
|---|---|---|
| 62-19902 | 9/1987 | Japan . |
| 1-116452 | 5/1989 | Japan . |
| 2197081 | 5/1988 | United Kingdom . |

OTHER PUBLICATIONS

IBM Technical Disclosure Bulletin, vol. 18, No. 11, Apr. 1976, pp. 3629–3630, by A. Bry et al. "Bypass Capacitor for Chip Probe".
Review of Scientific Instruments, vol. 45, No. 2, Mar. 1974, pp. 448–449, A New Capacitive Probe for the Measurement of High-Field Domains in Gunn Effect Devices by V. E. Riginos.

Primary Examiner—Kenneth A. Wieder
Assistant Examiner—William J. Burns
Attorney, Agent, or Firm—Charles W. Peterson, Jr.

[57] ABSTRACT

A probe interface assembly connects a set of signal lines and a set of power lines from a circuit tester to one integrated circuit (IC) chip disposed among multiple circuit chips on a semiconductor wafer. The assembly includes a plurality of electrically conductive planes including metal mesh and conductive strips which are spaced apart by ceramic planes contiguous the conductive planes. The signal lines and the power lines enter the assembly with relatively large spacing at an input plane facing the tester, and exit the assembly with relatively small spacing at an output plane facing the chip. Within the assembly, each power line branches into a plurality of conducting vias for reducing resistance and inductance of the power lines. Connection of the vias to the power lines is accomplished by conductive planes near the output plane. Other ones of the conductive planes, near the input plane, interconnect input and output signal lines. Ground planes are interposed between power planes and signal planes.

18 Claims, 7 Drawing Sheets

PROBE INTERFACE ASSEMBLY

BACKGROUND OF THE INVENTION

This invention relates to a system for interconnecting a tester of electric circuits with the circuit of a chip of a semiconductor wafer and, more particularly, to the construction of an interconnection interface with additional capacitance which serves as a source of stored energy for energizing power lines of the circuit during sudden transient demands for power during a testing of the chip circuit.

It is the practice to test the circuitry of each chip formed within a semiconductor wafer during the process of manufacturing integrated circuits. A circuit tester is used for this purpose. The tester has numerous wires for connection with the chip circuit, these wires including both signal lines and power lines. Typically, there are numerous signal lines and a few power lines. Generally, these wires are relatively large as compared to the physically small dimensions of the terminals of the chip circuit which are to be connected to the tester. Numerous test points of the circuit are to be connected to respective ones of the signal wires. Also, many circuit points of the chip circuit are to be powered with a common source of voltage so that each power line of the tester must make connection with numerous circuit points within the chip circuit.

In order to connect the wires of the tester to the terminals of the chip, various forms of interconnection systems have been devised, these systems employing an interface allowing for a fanning in of the wires from the tester to contact designated probes in a set of miniaturized probes which contact the chip terminals.

Generally, such interfaces have succeeded in establishing the desired connection between the tester wires and the chip terminals for conduction of tests of the chip circuitry. By way of example, the tests may include the application of various signals to the chip circuit and the observation of the circuit response to the test signals.

However, a problem arises in the situation wherein the test signals are administered at significantly higher frequencies and with pulse waveforms having more steeply defined leading and trailing edges than has been employed in the past. In responding to such stimuli, the chip circuit produces logic signals or other such signals having steep leading and trailing edges, which signals can be produced only by sudden changes in demand-for current from the power supply. In the usual case where a few voltages may be employed, sudden changes in demand for current appear on each of the power supply lines associated with the various voltages.

The rapid changes in demand for current are manifested on the power supply lines as high frequency signals including pulses with steep leading and trailing edges, wherein these high frequency signals carry significant amounts of power. Presently available connection interfaces are unable to provide the requisite transient response for delivering the rapid changes in current along the various power lines. Thus, instead of a sharply defined current pulse on a power line, the presently available interfaces produce a rounded current pulse. The rounded current pulse, in turn, affects the pulses produced by the chip circuit in response to the stimulus of the test signals. Consequently, the chip circuit is either unable to respond, or, alternatively, may respond with the generation of rounded signals instead of sharply defined signals.

The foregoing inadequate response of the chip circuit is detrimental for testing procedures because it tends to defeat one of the purposes of the test, namely, to determine how well the chip circuit performs. An inadequate response may be due to a malfunction within the chip circuit itself, or may be due to the failure of the power lines to deliver the rapidly changing demands for current. As a result, the presently available interfaces are suitable only for relatively low-frequency test signals rather than the higher-frequency signals necessary for operation of more modern chip circuits.

SUMMARY OF THE INVENTION

The aforementioned problem is overcome and other advantages are provided by an interconnection interface which connects the wires of a circuit tester to the terminals of a chip circuit under test wherein, in accordance with the invention, the interface is provided with additional capacitance adjacent miniaturized probes which contact the chip terminals to serve as a source of stored energy for energizing the power lines during transient demands for changes in current. In addition, the interface, in accordance with a further aspect of the invention, provides a configuration of power lines with reduced resistance and inductance so as to increase the bandwidth of the power lines, and, thereby, enable the power lines to operate with a faster transient response. By meeting the transient demands of current at various circuit points within the chip circuit, the multitude of transistors and other components of the chip circuit are provided with the requisite voltage and current during switching transients in the operation of the chip circuit. This enables the chip circuit to respond properly to the stimulus of the test signals to give a proper response to each stimulus.

In accordance with the invention, the connection interface is constructed as a stack of layers of electrically conductive material separated by layers of electrically insulating material. While the theory of the invention contemplates any of well-known dielectric insulation material including rubber, plastic and ceramic, preferably the electrically insulating material is formed of a ceramic, such as aluminum oxide, which has a relatively high dielectric constant to increase capacitance between adjacent electrically conductive layers. Each electrically conductive layer is provided with a specific function, and is given a physical structure suitable for carrying out this function. There are three functions, namely, the conduction of a signal, the provision of a ground plane, and the conduction of electric power.

The electrically conducting planes which serve the function of coupling signals may be referred to as signal planes, and are constructed in the manner of narrow conductive strips employed for the stripline form of transmission line. A ground plane is provided both above and below the strip conductor of each signal plane to complete the structure of the strip line form of transmission line. The width of the strip conductor, and the spacing between the strip conductor and the adjacent ground planes are selected to provide a desired impedance to the transmission line. If desired, the ground planes may be formed of solid foil, or partly or completely of metallic mesh rather than a solid metal plate.

The power planes, also, may be formed of foil, or partly or completely of metallic mesh. In a preferred embodiment of the invention, the power planes are constructed of metallic mesh, such as a copper screen, there being a ground plane both above and below each power plane. Each power plane provides current at a designated voltage to the chip circuit. The ground planes above and below the power plane electrically isolate the power plane from other power planes and the signal planes.

The wires from the tester approach the assembly of the interface from a first side thereof, and the miniaturized probes which make contact with the chip circuit are disposed at a central location on a second side of the interface assembly, the second side being opposite the first side, The power planes are located in a portion of the interface near the second side for providing the additional capacitance at a location as close as possible to the probes. The various signal-carrying probes extend by vias through the region of the power planes to contact the strip conductors of respective ones of the signal planes. The signal planes carry the various signals in a direction transverse to a longitudinal axis of the set of probes to points of connection of the various tester signal wires, these wires making connection with respective ones of the signal planes by the use of additional vias extending from the conductive strips of the various signal planes through the first side of the assembly to connect with the respective wires. As is well known, a stripline form of transmission line supports a transverse electromagnetic (TEM) wave of wide bandwidth suitable for transmission of high-frequency signals.

Each of the power planes is also provided, in a central portion of the power plane, with an electrically conductive strip or finger which extends through the set of probes to make electrical contact with many of the power probes such that a single power-plane finger contacts all the power probes requiring a specific value of voltage. In this way, all circuit points of the chip requiring a specific voltage are connected by their respective probes to the designated power plane supplying that voltage. Each of the power planes extends from the aforementioned centrally located axis radially outward from the axis towards an outer perimeter of the interface assembly. While the outer perimeter may have any desired geometric shape, such as a circle or square, the square shape has been employed in construction of a preferred embodiment of the invention. It is noted that the perimetric portions of the interface assembly are distant from the vias conducting the signals, the signal vias being located relatively close to the aforementioned axis which extends at a central location through the interface assembly. Therefore, there is sufficient space to connect numerous vias to each of the power planes for connection of each power plane to the respective power wire of the tester.

The power-conducting vias of the respective power planes are arranged in groups of vias disposed about the aforementioned axis, the array of power vias of each group encircling the axis as well as signal vias. The use of numerous power vias for interconnecting each power plane to its respective tester wire reduces the resistance and inductance of the connection between power playing and tester wire. Also, for improved electrical isolation between power vias and signals vias, further vias or pins which interconnect ground planes are disposed between the power vias and the signal vias. Additional ground planes are disposed between the group of power planes and the group of signal planes for increasing electrical insulation between the power planes and the signal planes. The reduced resistance and inductance in each group of power vias increases the bandwidth of the power connection and provides for a faster transient response to aid in meeting the demands for changing current on the power lines.

As a further feature of the invention, additional capacitance is provided between each power plane and the adjacent ground planes by reducing the thickness of the insulating planes disposed between the ground planes and each of the power planes as compared to the thickness of the insulating layers disposed on each side of a signal plane. Further capacitance is provided by connecting capacitors to respective ones of the power planes, each capacitor being connected in parallel between a power plane and an adjacent ground plane. The capacitors are located outside the interface assembly along the second side thereof so as to be as close as possible to the chip circuit. The additional capacitance provided by the close spacing between a power plane and its adjacent ground planes enables a rapid high-frequency response to needs of additional current for meeting the transient demands of the chip circuit. The external capacitors provide the same function but respond more slowly than the parallel-plate capacitors of each power plane and associated ground planes to meet the lower-frequency transient requirements for current by the chip circuit. Still lower-frequency portions of the transient demand can be met directly by the power supply of the tester itself because such low-frequency demand is well within the bandwidth of the interface and the connecting wires from the tester.

BRIEF DESCRIPTION OF THE DRAWING

The aforementioned aspects and other features of the invention are explained in the following description, taken in connection with the accompanying drawing wherein.

DETAILED DESCRIPTION

Figure 1:
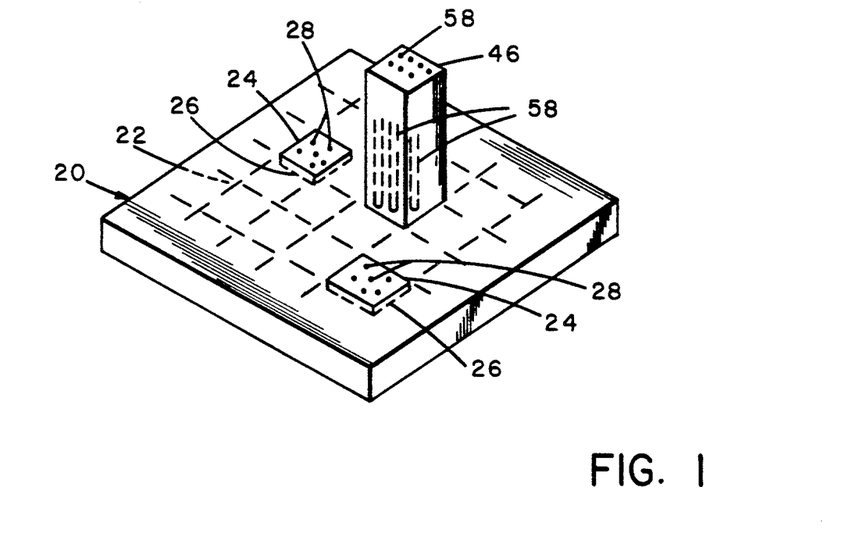
FIG. 1 is a stylized perspective view of a semiconductor wafer with chips therein, the chips having circuits to be tested.

FIG. 1 shows a semiconductor wafer 20 within a grid 22 superposed thereon to show locations of a plurality of circuit chips 24 which are to be cut from the wafer 20 upon completion of the process of manufacturing the circuits of the individual chips 24. Each chip 24 includes an electric circuit 26, indicated in phantom, and a plurality of terminals 28 providing access to the circuits 26 during a testing of the circuit of each of the chips 24.

Figure 2:
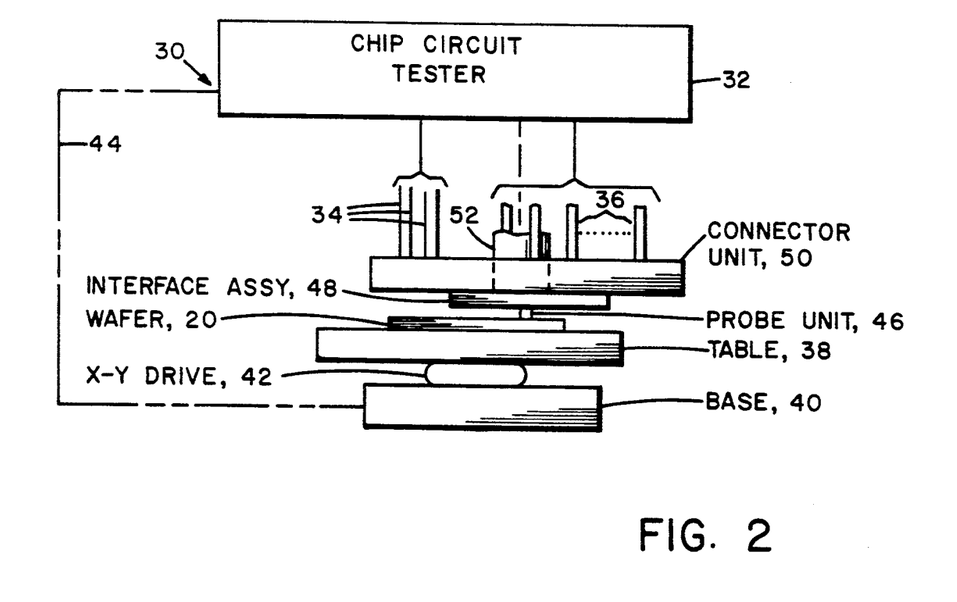
FIG. 2 is a stylized elevation view of a chip testing system for testing chips of FIG. 1, the system of FIG. 2 including an interface assembly incorporating the invention.

FIG. 2 shows a system 30 incorporating features of the invention for testing the circuits 26 of individual ones of the chips 24 of the wafer 20. The system 30 includes a chip circuit tester 32 coupled via power cables 34 and signal cables 36 to a specific chip 24 of the wafer 20 for testing the circuit 26 of the specific chip 24. Preferably the signal lines 36 are fabricated as coaxial cables.

The system 30 further comprises a table 38 for supporting the wafer 20 during a testing of the chip circuit. The table 38, in turn, is supported by a fixed base 40, and is connected to the base 40 by an x-y drive unit 42 which serves to move the table 38 in both x and y directions to reposition the wafer 20 at each cell of the grid 22 so as to accomplish a sequential testing of each of the chip circuits. The tester 32 may be mechanically connected to the base 40, as indicated by dashed line 44, to be supported by the base 40.

The system 30 includes also a probe unit 46 by which the power lines 44 and the signal lines 36 make contact with the terminals 28 of a designated one of the chips 24 (shown also in FIG. 1), an interface assembly 48 connected to the probe unit 46, and a connector unit 50 providing for electrical connection of the power cables 34 and the signal cables 36 to the interface assembly 48. A stud 52 provides rigid mechanical interconnection of the connector unit 50 to the tester 32. The stud 52 extends through the connector for securing the interface assembly 48 to the connector unit 50.

Figure 3:
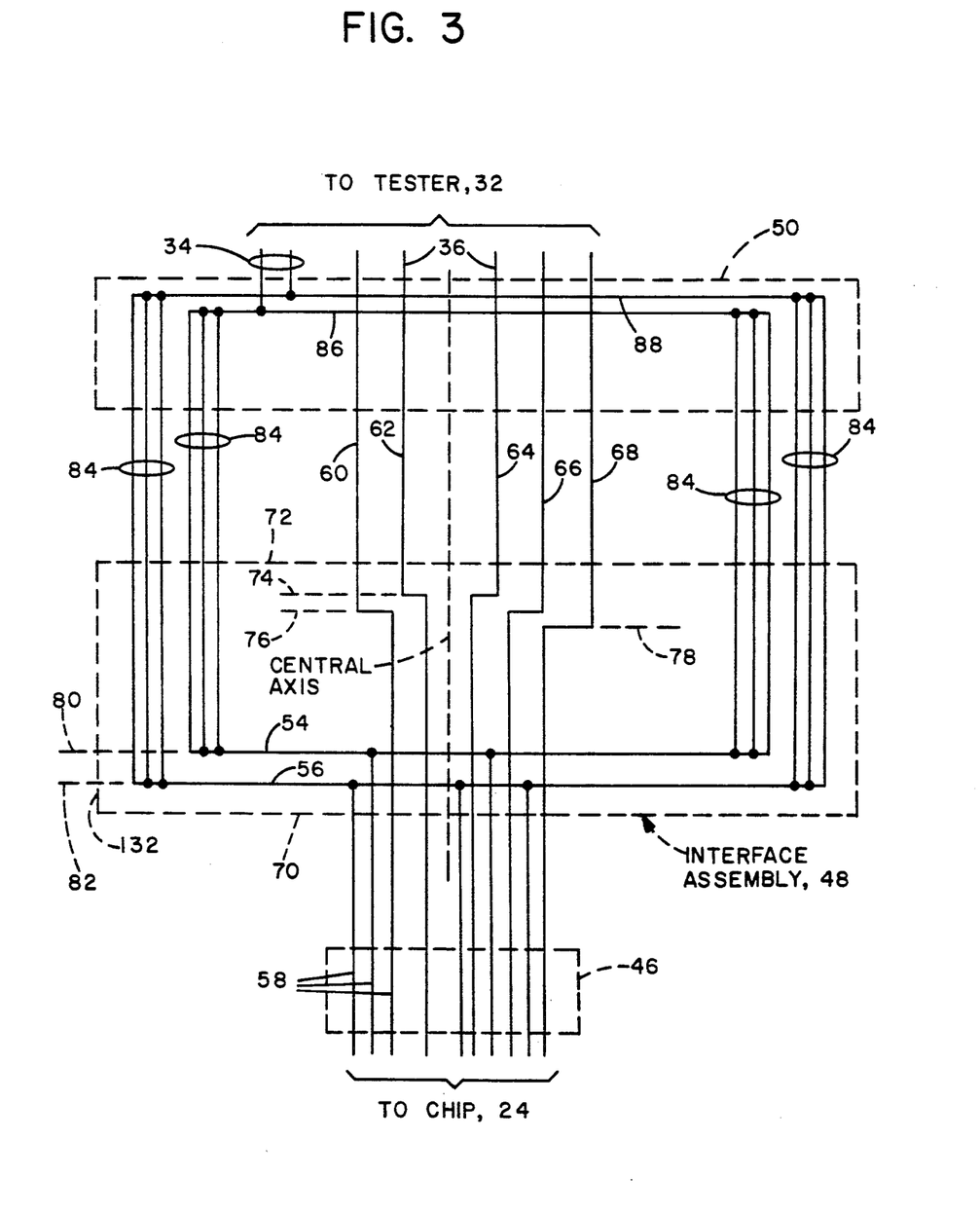
FIG. 3 is a diagrammatic view of a portion of the system of FIG. 2, FIG. 3 showing electrical conducting paths for both power and signals between a chip under test and a chip circuit tester of FIG. 2, the electrical conducting paths passing through the interface assembly.

FIG. 3 shows schematically electrically conductive paths extending from a chip 24 to the tester 32, the electrically conductive paths extending through the probe unit 46 and the interface assembly 48 and the connector unit 50. Typically, in one construction of a chip circuit 26, a plurality of different values of voltage are employed. For example, there may be four separate voltages and a ground employed for energizing the chip circuit. By way of example in describing the invention, FIG. 3 shows two power lines 54 and 56. It is the practice in the construction of chip circuits to form the terminals 28 as pads, and to provide numerous pads at each voltage for conducting each of the voltages to the numerous locations within the chip circuits requiring a power input at a specific voltage. The probe unit 46 has numerous probes 58 (shown also in FIG. 1) for making electrical contact with the chip terminals, there being a plurality of the probes 58 for connecting power at a single voltage to the set of the chip terminals dispensing the particular voltage to the chip circuit. To demonstrate the interconnection of a single power line, such as the power lines 54 and 56 to a plurality of the probes 58, the power line 54 is shown connected to two of the probes 58, by way of example, and the power line 56 is shown connected to three of the probes 58. With respect to the conduction of signals between the tester 32 and the chip 24, there is generally one terminal of the chip circuit which receives a specific signal and, accordingly, FIG. 3 shows five separate signal lines 60, 62, 64, 66, and 68 connected to individual ones of the probes 58 and extending from the probes 58 via the interface assembly 48 and the connector unit 50 to the tester 52. The probe assembly 46 is located at a central position on the bottom, or chip side 70 of the interface assembly 48 in coaxial alignment with the stud 52 which faces the top side or tester side 72 of the interface assembly 48. The signal lines 60-68 are deflected transversely, via signal planes parallel to the chip side 70, within the interface assembly 48 to provide clearance of the stud 52. Three signal planes 74, 76, and 78 are shown diagrammatically in FIG. 3, by way of example.

It is noted, also, that the probes 58 are spaced very closely together to accommodate the small size of a chip 24, while the power cables 34 and the signal cables 36 which extend from the connector unit 50 to the tester 32 are spaced apart with much greater spacing than that of the probes 58. The transverse deflection of the signal lines 60-68 at the signal planes 74, 76, and 78 also provides the transition between the very small spacing of the probes 58 and the usual spacing of wiring harnesses or cabling of the cables 34 and 36. The interface assembly 48 includes also power planes 80 and 82 to provide for a transverse deflection of the power lines 54 and 56 so as to provide clearance of the signal lines 60-68. Also, as will be described hereinafter with respect to a specific feature of the invention, it is advantageous to provide numerous electrically conductive pins 84 for each of the power lines 54 and 56, the pins 84 extending from the power planes 80 and 82 to provide for parallel paths of conduction from the power planes 80 and 82 to the connector unit 50. In the connector unit 50, the pins 84 of the power line 54 are connected together by a metallic plate 86, the plate 86 interconnecting the pins 84 with an electrical conductor of a power cable 34. Similarly, a metallic plate 88 provides interconnection between the pins 84 of the power line 56 with an electrical conductor of other of the power cables 34. The plates 86 and 88 are fabricated in a well-known fashion with apertures allowing passage of the signal lines 60-68 for connection with respective ones of the signal cables 36.

Figure 4:
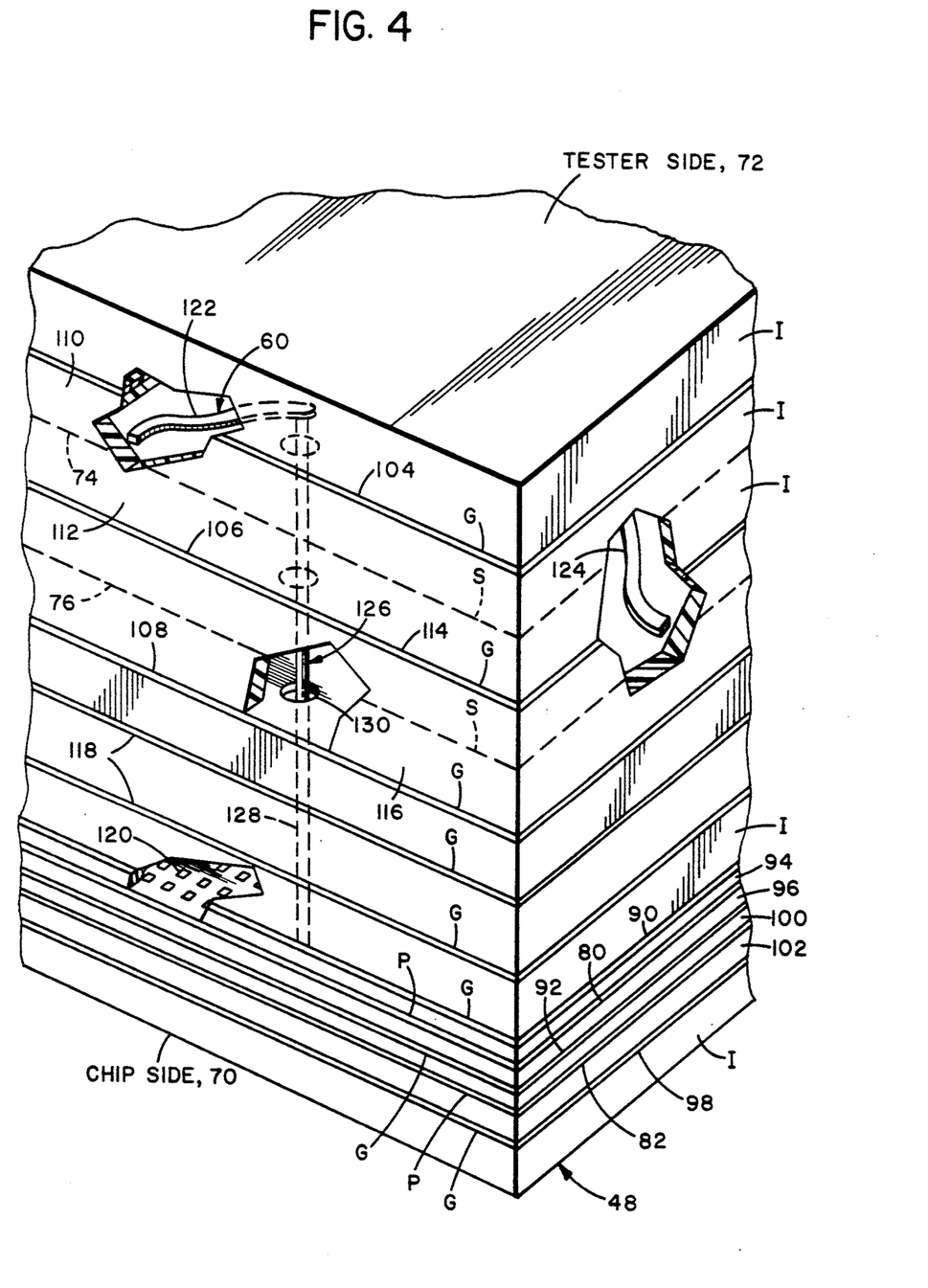
FIG. 4 is a perspective view showing essential components of the interface assembly of FIGS. 1 and 3.

FIG. 4 shows the actual construction of the interface assembly 48. The interface assembly 48 is constructed in laminar form, and includes the various power planes, of which only the planes 80 and 82 are shown by way of example, and also includes various signal planes of which only the planes 74 and 76 are shown by way of example. Ground planes 90 and 92 are placed on opposite sides of the power plane 80, and are spaced apart from the power plane 80 by insulation layers 94 and 96, respectively. The ground plane 92 and a further ground plane 98 are disposed on opposite sides of the power plane 82, and are spaced apart from the power plane 82 by insulation layers 100 and 102. To facilitate a viewing of FIG. 4, each of the ground planes is further identified by the legend G, each of the power planes is identified by the legend P, each of the signal planes is identified by the letter S, and the insulation planes are identified by the legend I.

Each of the signal planes 74 and 76 is also located between a pair of ground planes. Thus, the signal plane 74 is disposed between ground plane 104 and ground plane 106. Similarly, the signal plane 76 is disposed between the ground plane 106 and a ground plane 108. The signal plane 74 is spaced apart from the ground planes 104 and 106 by insulation layers 110 and 112, and the signal plane 76 is spaced apart from the ground planes 106 and 108 by insulation layers 114 and 116. Additional ground planes 118 are disposed between the upper portion of the interface assembly 48 containing the signal planes and the lower portion of the interface assembly 48 containing the power planes to provide additional shielding between the electric power lines and the signal lines.

The power planes and the ground planes may be constructed of metallic foil, such as copper foil, deposited upon an insulation layer or, alternatively, if desired, a power plane or a ground plane may be constructed at least in part in the form of a mesh, indicated at 120 in a cut-away portion of the interface assembly 48. The mesh 120 reduces the overall weight of the assembly 48, and may also improve adhesion of the power or ground plane to an insulation layer I.

For construction of a signal plane S, a stripline form of transmission line is employed, with the stripline comprising a strip conductor disposed in a signal plane and being located parallel to and spaced apart from two ground planes. By way of example, two cut-away portions of the assembly 48 are provided to show the center strip conductor of a stripline. In the signal plane 74, a strip conductor 122 is located in the plane 74 between and parallel to the ground planes 104 and 106. The strip conductor 122 is spaced apart from the ground plane 104 and 106 by the insulation layers 110 and 112. The impedance of the stripline may have a value of 50 ohms by way of example, the impedance being established in well-known fashion by the width of the strip conductor 122, the spacing between the strip conductor 122 and each of the ground planes 104 and 106, and the dielectric constant of the material employed in constructing the insulation layers 110 and 112. In the preferred embodiment of the invention, all of the insulation layers I are constructed of alumina. Similarly, in the signal plane 76, there is disposed a strip conductor 124 which is located equidistant between the ground planes 106 and 108. the strip conductors 122 and 124 extend in the transverse direction to provide for the above-noted transverse deflection of the signal paths of the signal lines 60–68 (FIG. 3) which allows for the widely spaced signal cables 36 to connect with the closely spaced probes 58.

Propagation of signals in the vertical direction, this being in the direction perpendicular to the ground planes G, is accomplished by way of vias one such via 126 being shown in FIG. 4. The vias are constructed in well-known fashion, the via 126 including an electrically conductive post 128 extending through apertures, such as an aperture 130 in the ground plane 108, with similar apertures being provided through other electrically conductive planes through which the post 128 is to pass in insulated fashion. The top of the post 128 is shown connected electrically to the strip conductor 122. Vias, such as the via 126 are employed for conducting signals in the vertical direction in the interface assembly 48 between respective ones of the signal planes 74, 76, and 78 FIG. 3) and the connector unit 50, as well as in the reverse direction from the signal planes to the probe unit 46.

Figure 5:
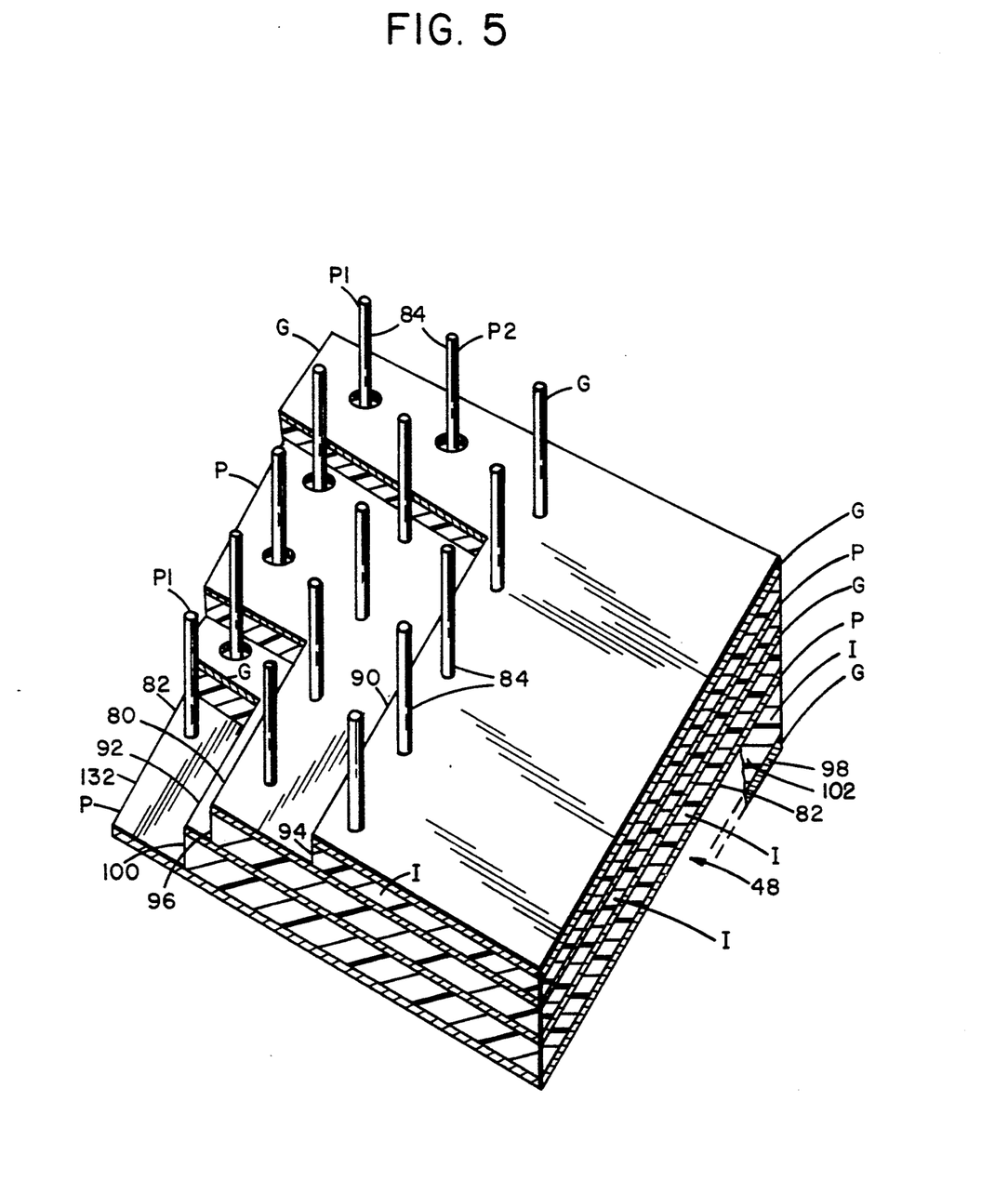
FIG. 5 is a partial view, the lower left hand side in FIG. 3, of the interface assembly showing a power plane and two adjacent ground planes with electrically conductive pins extending from the three planes.

FIG. 5 shows a portion of the interface assembly 48, the portion being located at the bottom left side 132 (FIG. 3) of the assembly 48. FIG. 5 shows the power plane 82 and the ground plane 92 and 98 disposed above and below the power plane 82. Also shown are the insulation layers 100 and 102 disposed above and below the power plane 82. FIG. 5 demonstrates the arrangement of the pins 84 upstanding from the power plane 82, and shows how the pins 84 extend in the manner of vias through successive planes and layers of the interface assembly. By way of example, a pin 84 is shown to pass through a via 130 of the ground plane 92.

In accordance with a feature of the invention, additional pins 84 are provided for shielding the power line 56 (FIG. 3) from other ones of the power lines as well as from the signal lines. This is accomplished by providing a further set of pins 84 upstanding from the ground plane 98 and another set of pins 84 upstanding from the ground plane 92. The set of pins 84 upstanding from the ground plane 98 are disposed between the pins of the power plane 82 and the left side 132 of the assembly 48. The set of pins 84 upstanding from the ground plane 92 are disposed along a side of the power-plane pins 84 facing the center of the assembly 48. All of the pins 84 extend upward through successive layers and planes of the assembly 48 in the manner of vias. However, it is noted that the inner and outer rows of pins 84 from the ground planes 92 and 98 produce, in essence, a shielding wall on both sides of the row of pins 84 of the power plane 82. As will be disclosed hereinafter, the three rows of pins 84 extend completely around the perimetric portion of the interface assembly 48 so as to fully shield electrically the pins 84 of the power plane 82. It is noted also that the use of numerous pins 84, instead of a single connecting line, in the fabrication of the power line 56, provides for reduced resistance and inductance in the power line 56 which facilitates in the transfer of power from the tester 32 to the chip 24, particularly in the case of transient loading of the circuit 26 of the chip 24.

With reference to FIGS. 3, 4, and 5, all of the ground planes G are connected together electrically, and are also connected via one or more of the probes 58 to ground terminals or pads within the circuit of the chip 24. Also, within the power cables 34, a conductor is provided for connecting the ground planes G to circuitry within the tester 32. Additional ground plane connections between the tester side 72 of the interface assembly 48 to the tester 32 are provided by the outer conductor of the coaxial cables in the signal cables 36. As can be seen in FIG. 5, the physical construction of the ground path is the same as the path over which power is conducted, both pads comprising a metallic plane and a set of metallic pins. To simplify the drawing of FIG. 3, a set of lines representing the ground path has been omitted.

In accordance with a further feature of the invention, the insulation layers 94, 96, 100 and 102 of the power planes 80 and 82 are substantially thinner than the insulation layers 110, 112, 114, and 116 of the signal planes 74 and 76 to provide for increased capacitance between the power plane 80 and its two ground planes 90 and 92, and between the power plane 82 and its two ground planes 92 and 98. The increased capacitance between each of the power planes P and its associated ground planes G provide increased storage of electric energy to power the chip circuit 26 during switching transients when surge currents appear on the power lines such as the power lines 54 and 56.

Figure 6:
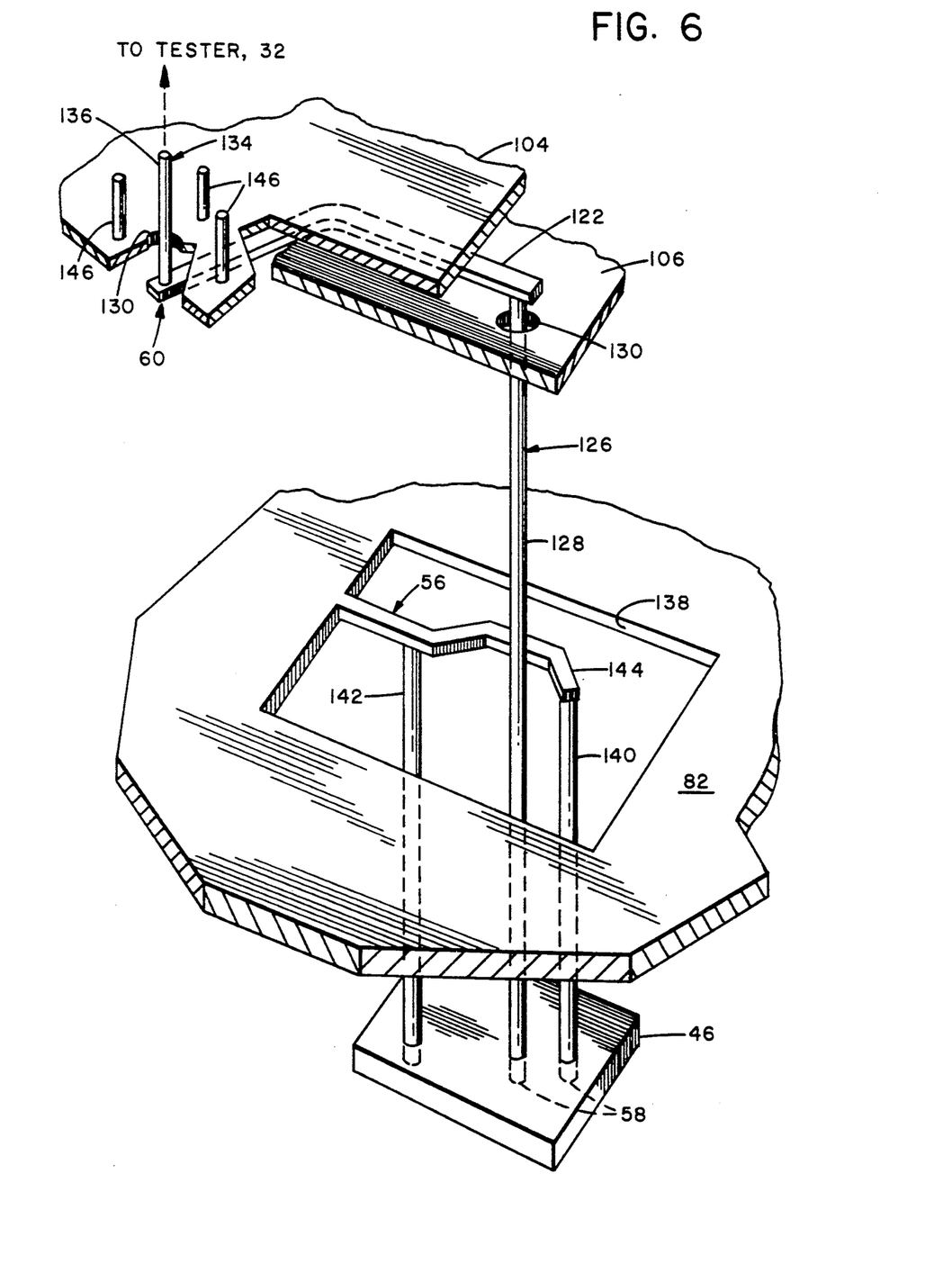
FIG. 6 is a simplified view of the interface assembly showing construction of an electrically conducting path of a signal line, and the connection of a power plane with power probes of a probe unit.

FIG. 6 shows further details in the construction of a signal line, such as the signal line 60 disclosed in FIGS. 3 and 4. In the extension of the signal line 60 from a probe 58 of the probe unit 46 through the interface assembly 48 to the tester 32, the signal line 60 comprises the previously-described via 126 and strip conductor 122. In addition, the signal line 60 comprises a via 134 extending upward from the strip conductor 122 toward the connector unit 50 and the tester 32. The via 134 comprises a post 136 which passes through an aperture 130 in the ground plane 104. The elongated strip conductor 122 extends from a terminus of the post 136 to a terminus of the post 128. To simplify the presentation of the invention, FIG. 6 shows only one of the power planes, namely the plane 82. The power plane 82 has a central aperture or window 138 through which the post 128 passes to connect the strip conductor 122 with a probe 58. While not shown in FIG. 6, the other ground planes, such as the ground planes 90, 92, and 98, as well as other planes, such as the power plane 80 each have a window such as the window 138 to allow for passage of the post 128, the windows 138 allowing for passage of vias of other ones of the signal lines 62-68 (FIG. 3). As has been described above with reference to FIG. 3, the power line 56 is connected to a plurality of the probes 58, this connection being made by a plurality of posts, two such posts 140 and 142 shown in FIG. 6. The power line 56 includes, in addition to the aforementioned pins 84 and power plane 82, a finger 144 which extends into the window 138 to make electrical connection with the posts 140 and 142. Similar electrically conductive fingers are employed in the windows of other ones of the power planes, such as the power plane 80. The fingers 144 are, in general, provided with a serpentine form so as to thread between various ones of the vias of the signal lines 60-68.

In accordance with a further feature of the invention, the post 136 of the via 134 is encircled by a plurality of pins 146, four of the pins 146 being employed in the preferred embodiment of the invention. The pins 126 are upstanding from the ground plane 104 and are formed of electrically conductive metal so as to provide an electrostatic shield about the via 134 so as to shield signals carried by the via 134 from the signals carried by the corresponding vias of other ones of the signal lines 62-68. Each of the signal lines 60-68 include the construction of the pins 146, as depicted for the signal line 60 in FIG. 6. The pins 146 extend upwardly through further ones of the planes and layers (not shown in FIG. 6) of the interface assembly 48, and make contact with other ground planes G, while avoiding contact with strip conductors, such as the conductor 122, in other ones of the signal lines 60-68.

Figure 7:
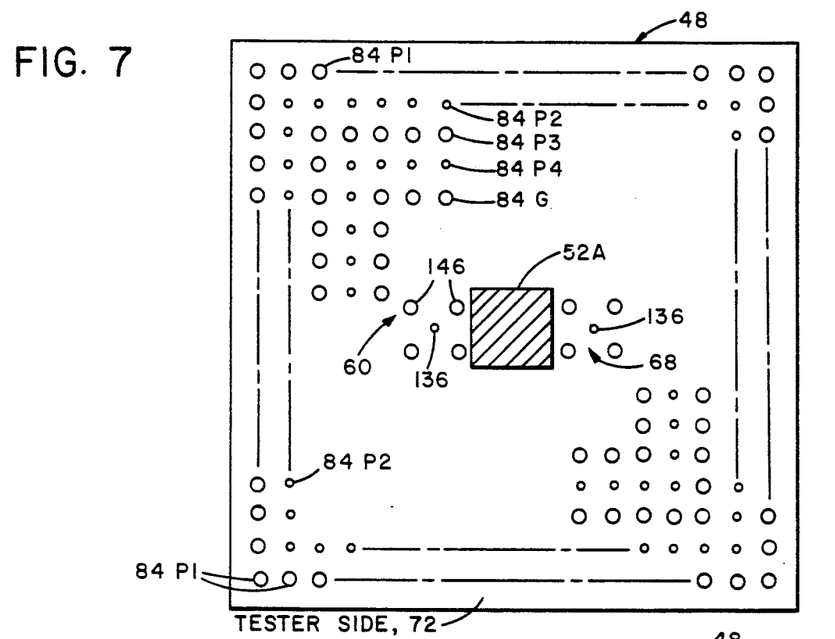
FIG. 7 is a top plan of the interface assembly showing a side thereof facing the circuit tester of FIG. 2.

FIG. 7 shows a plan view of the interface assembly 48 as viewed from the tester side 72 of the assembly 48. The pins 84 of FIG. 5 extend up to the top surface, namely the tester side 72, and are visible in FIG. 7. To facilitate identification of various ones of the pins 84, the pins connected to ground planes are identified further by the legend G, namely 84G, and pins connected to a power plane are identified further by the legend P, namely 84P. With respect to the signal line 60-68, two of these lines, namely the signal lines 60 and 68, are shown by way of example in FIG. 7. Each of these lines has the via post 136 extending through the tester side 72, and each via post 136 is surrounded by the pins 146 which extend also up to the tester side 72 of the interface assembly 48. The various pins are disposed in an array encircling the mounting stud 52. The ground pins 84G and the power pins 84P are arranged in a square array of the preferred embodiment of the invention.

Figure 8:
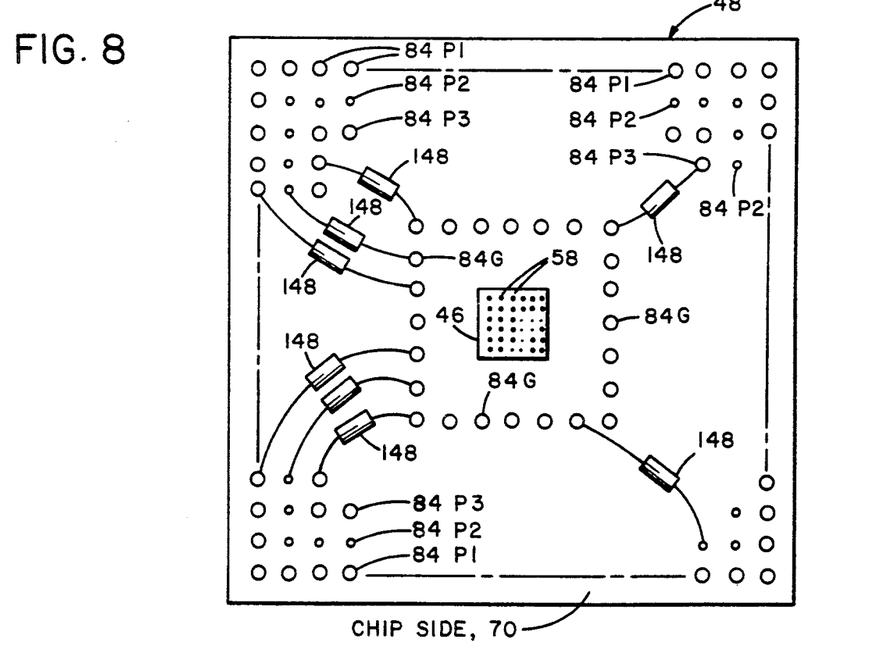
FIG. 8 is a plan view of the interface assembly showing a bottom side thereof which faces a chip under test.

FIG. 8 shows the bottom or chip side 70 of the interface assembly 48. The probe unit 46 is located at the center of the chip side 70, and includes the array of probes 58. The pins 84G and 84P, shown previously in FIG. 7 are also extended downwardly to appear at the chip side 70. In accordance with a feature of the invention, capacitors 148 are connected between pins 84P and 84G to increase capacitance between the power plane 82 (FIG. 5) and its adjacent ground planes 98 and 92, as well as the power plane 80 (FIG. 4) and its adjacent power planes 92 and 90. It is to be understood that FIG. 8 has been shown somewhat oversized with the result that capacitors 148 appear to have leads. However, this is done for illustration purposes only, in that in the preferred embodiment, capacitors 148 are preferably chip capacitors which are surface mount capacitors. Therefore, capacitors 148 in actuality would preferably not have any leads, thereby eliminating the potential for additional capacitance and are possible since the pads are actually very close together, thereby facilitating surface mount chip capacitors. The mounting of the capacitors 148 directed on the chip side 70 places these capacitors in close proximity to the ground and the power planes so as to increase the capacitance without the introduction of excessive resistance and inductance which would reduce the effectiveness of the capacitors 148 in providing additional current to the chip circuit 26 during transient switching periods. Thus, the combination of the capacitance provided by the parallel ground planes and the external capacitors 148 provides for a suitable source of energy in close proximity to the chip 24 under test. The capacitance of the parallel place provides the fast response to transient demands for current, and the capacitors 148 provide power at a slightly lower frequency of response to cover the transient situation.

Figure 9:
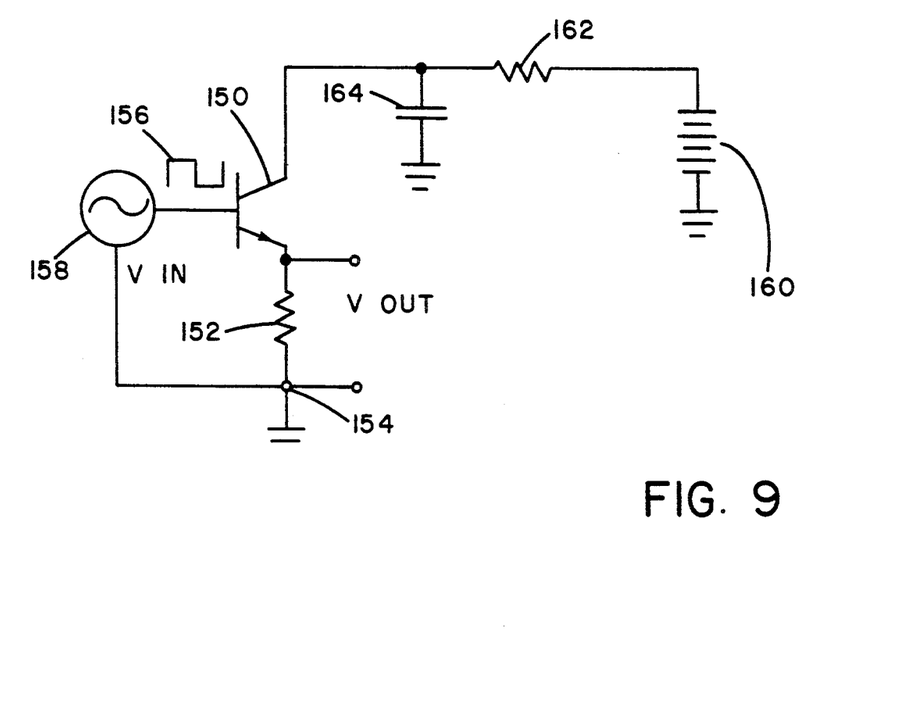
FIG. 9 is a portion of a chip circuit demonstrating operation of the invention.

FIG. 9 is an example of a portion of circuitry which may appear in a chip circuit 26. FIG. 9 shows a transistor 150 having an emitter terminal connected via a resistor 152 to ground 154, and having a base terminal which receives an input signal depicted as a square wave signal 156 from a signal source 158. The source 158 may be, by way of example, a flip flop or other circuit element, and is connected between the base terminal of the transistor 150 and ground 154. Power for the transistor 150 is provided by a power source located in the tester 32, the power source being represented in the circuit of FIG. 9 by a battery 160. Current from the battery 160 flows from a positive terminal thereof via an impedance element 162 to the collector terminal of the transistor 150. The negative terminal of the battery 160 is grounded. A capacitor 164 is connected between ground and the junction of the transistor 150 with the impedance element 162.

In accordance with the practice of the invention, the impedance element 162 represents resistive and inductive impedance factors present in the power cables 34 (FIGS. 2 and 3). The capacitor 164 represents the combined capacitance of the capacitors 148 plus the parallel plate capacitor comprising a power plane, such as the power plane 82 (FIG. 5) and the adjacent ground planes such as the ground planes 98 and 92 (FIG. 5).

Figure 10:
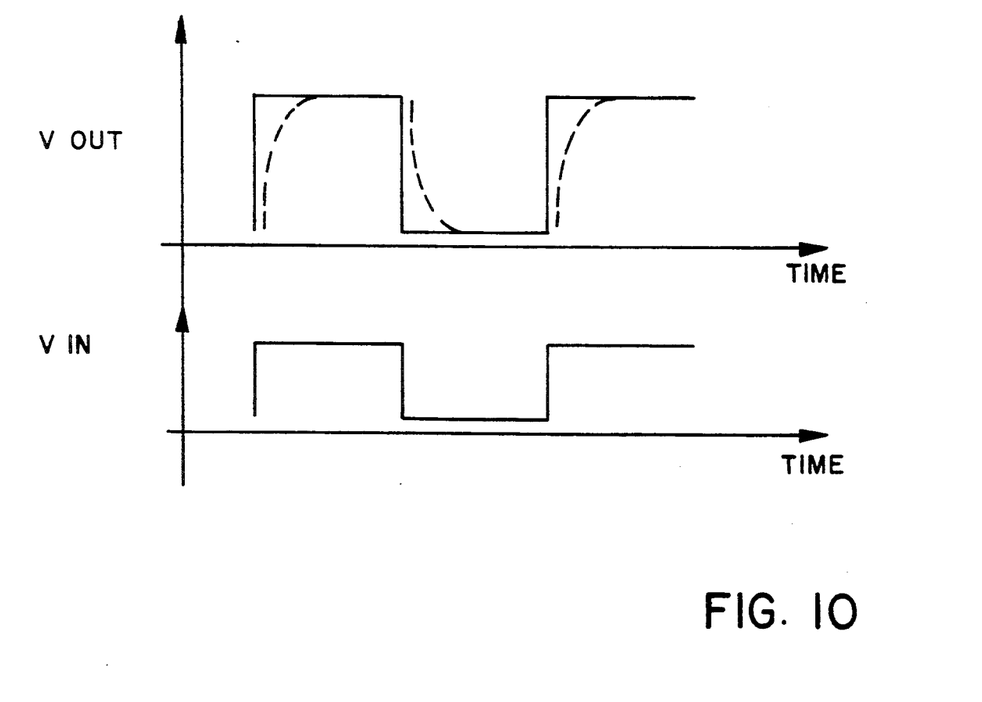
FIG. 10 is a graph of waveforms produced in the operation of the circuit of FIG. 9.

The effect of the invention can be noted with reference to FIG. 10 wherein the upper graph represents an output voltage of the circuit of FIG. 9, the output voltage being taken as the voltage drop across the emitter resistor 152. The input voltage shown in the lower graph of FIG. 10 is the square-wave logic signal applied between the base terminal of the transistor and ground. The solid trace in the graph of the output voltage represents the output voltage in the situation wherein the capacitor 164 is present in FIG. 9, the waveform of the solid trace substantially replicating that of the input voltage signal. In the absence of the capacitor 164, the output voltage would be altered, as indicated by the dashed trace, the alteration in output-voltage waveform occurring, as in the prior art, because of transient voltage drop induced by sudden transient changes in current through the impedance element 162. However, by virtue of the sources of capacitance provided in the interface assembly 48 by the practice of the invention, this capacitance being represented by the capacitor 164 in FIG. 9, there is sufficient stored energy in the capacitor 164 to provide the transient current to the transistor 150 while retaining the voltage between collector terminal and ground. This produces the beneficial result wherein the output voltage is able to follow a fast transient change in the input voltage.

The invention allows testing of chips in a test environment wherein signal voltages change with rise times as fast as 0.4 nanoseconds per volt. While the principles in the construction of the invention allow for any desired material for producing the insulation layers ranging from rubber to plastic to ceramic materials, optimum results have been obtained by use of ceramic dielectric material such as the above-noted alumina, a ceramic having at least 92% $Al_2O_3$.

The foregoing ceramic provides a dielectric constant of 8.9. The thickness of each of the insulation layers, such as the insulation layers 94, 96, 100 and 102 (FIG. 4) disposed between the power and the ground planes is 4 mils. The thickness of the insulation layers, such as the layers 110, 112, 114, and 116 (FIG. 4) disposed between the signal and the ground planes is 14 mils. The average via diameter at the probe unit 46 is 4 mils, while the nominal via diameter between the power planes and the tester side 72 of the interface assembly 48 is 8 mils. With reference to FIG. 9, the capacitor 164 may be viewed alternately as a supply of energy to provide power surges as required for transient current flow, or as a decoupling network which decouples the transistor 150 from the battery 160 during transient changes in current flow. By way of example, the response bandwidth of the power supplies customarily utilized in circuit testing equipment is on the order of 10 KHz. However, tests must be accomplished with signal bandwidths in the megahertz range. Therefore, one cannot rely on the power supply to support transient currents but, must employ the invention with the additional capacitance provided as close to the chip circuit as is physically possible. The capacitors 148 (FIG. 8) have values of typically 1.5 microfarads and are constructed with minimum parasitic conductance. The capacitors 148 may be made by alternating depositions of thin film layers of dielectric and metal so as to reduce any inductance which may be present in the capacitor 148. Transient changes in the magnitude of current can be greater than 2 amperes per nanosecond, possibly as high as 5 or 7 amperes per nanosecond.

With respect to physical dimensions of the interface assembly 48, the stud 52 has cross-sectional dimensions of approximately 250 mils by 250 mils, with the dimensions of the probe unit 46 being somewhat smaller. In the case wherein four values of powersupply voltage are employed, a total of 20 of the capacitors 148 may be utilized. The capacitance between a power plane and its two ground planes can be as high as 16,000 picofarads. The metal foil employed in the construction of the ground and the power planes has a thickness of 0.75 mils. In the case of the use of ceramic material for the insulation layers, the foil of the ground and the power planes may be secured by means of an adhesive binding material. This may be accomplished by a well-known thick film process wherein there is an extrusion of metal paste into the ceramic, as by a silk screen printing process. This is followed by a baking process to produce the monolithic structure of the interface assembly 48. The capacitors 148 are located at a distance of 8 mils from the surface of the wafer 20. The thickness of the interface assembly 48, as measured between the chip side 70 to the tester side 72, is 200 mils in a preferred embodiment of the invention. The transverse dimensions of the interface assembly 48 provide a square configuration measuring in the range of 3 to 4 inches on a side. The pins 84 (FIGS. 7 and 8) are located on a grid with spacings on center of 100 mils. The arrangement of pins which shield the power lines provide for substantial elimination of crosstalk with 50 dB (decibels) isolation. In the probe unit 46, the electrical conductors measure 4 mils in diameter and are spaced apart on centers with a spacing of 10 mils. If desired, additional grounding pins, such as the pins 84G of FIG. 7 may be interposed between the signal lines 760–68 (FIG. 3) and the power lines 34.

By virtue of the invention, the interface assembly 48 allows a test of a chip circuit to proceed with test waveforms being produced with much greater accuracy than has been obtained heretofore, this allowing the test to show, not only whether or not a chip is functioning properly, but to ascertain how well the chip circuit is actually functioning.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A probe interface assembly for connecting a circuit tester to a circuit chip, the assembly comprising:
    a plurality of parallel electrically conductive planes, and a plurality of electrically insulating planes disposed between the electrically conductive planes;
    an array of terminals on a first side of the assembly facing the circuit tester for connection with the circuit tester, and an array of probes on a second side of the assembly facing the circuit chip for connection with the circuit chip;
    means for connecting individual ones of said array of terminals with individual ones of said array of probes, said means for connecting including a plurality of vias extending through individual ones of said conductive planes and individual ones of said insulating planes for communicating electrical signals and electric power from said first side to a second side of the assembly;
    wherein said plurality of parallel electrically conductive planes includes a set of signal planes comprising strip conductors for conducting electric signals, a set of power planes for conducting electric power, and a set of ground planes;
    individual ones of said signal planes are disposed adjacent individual ones of said power planes to form a transmission line with a desired impedance;

individual ones of said ground planes are disposed adjacent individual ones of said power planes to form capacitors with said individual power planes, said set of power planes includes at least one power plane for conduction of electric power at at least one voltage, and each of said insulating planes disposed between a power plane and a ground plane is composed of dielectric material for increasing capacitance of one of said capacitors; and wherein said power planes are located in a portion of the assembly closer to said second side, and said signal planes are located in a portion of said assembly closer to said first side in order to minimize lengths of paths for conduction of signals from the tester to the chip.

2. The assembly according to claim 1 wherein a power via group comprises a plurality of power vias connecting a plurality of said array of terminals to one of said power planes in order to reduce resistance and inductance in the conduction of current from the first side of the assembly to the power plane.

3. An assembly according to claim 2 further comprising a plurality of capacitors disposed along said second side of said assembly and connected electrically in parallel between a power plane and an adjacent ground plane.

4. An assembly according to claim 1 further comprising a plurality of ground planes disposed between the portion of said assembly containing the power planes and the portion of said assembly containing the signal planes in order to isolate electrically the power planes from the signal planes.

5. A probe interface assembly for connecting a circuit tester to a circuit chip, the assembly comprising:
a plurality of parallel electrically conductive planes, and a plurality of electrically insulating planes disposed between the electrically conductive planes;
an array of terminals on a first side of the assembly facing the circuit tester for connection with the circuit tester, and an array of probes on a second side of the assembly facing the circuit chip for connection with the circuit chip;
a means for connecting individual ones of said array of terminals with individual ones of said array of probes, said means for connecting including a plurality of vias extending through individual ones of said conductive planes and individual ones of said insulating planes for communicating electrical signals and electrical power from said first side to a second side of the assembly;
wherein said plurality of parallel electrically conductive planes includes a set of signal planes comprising strip conductors for conducting electric signals, a set of power planes for conducting electric power, and a set of ground planes;
individual ones of said signal planes are disposed adjacent individual ones of said power planes to form a transmission line with a desired impedance;
individual ones of said ground planes are disposed adjacent individual ones of said power planes to form capacitors with said individual power planes, said set of power planes includes at least one power plane for conduction of electric power at at least one voltage and each of said insulating planes disposed between a power plane and a ground plane is composed of dielectric material for increasing capacitance of one of said capacitors; and a plurality of grounded vias encircling said one signal via.

6. An assembly according to claim 2 wherein, in the connection of any one of said power planes to its power via group, there is a plurality of power vias connecting between the power plane and a plurality of said array of terminals, said plurality of power vias being arranged symmetrically about an axis directed normally to said electrically conductive planes.

7. An assembly according to claim 6 wherein said axis passes through said array of probes on said second side of said assembly.

8. An assembly according to claim 6 wherein, in the connection of any one of said power planes to its power via group, there is a plurality of power vias connecting between the power plane and a plurality of said probes.

9. An assembly according to claim 6 further comprising an outer ring of ground pins adjacent said power vias of a power via group and an inner ring of ground pins adjacent by said power vias of said power via group for shielding one power via group from another power via group.

10. A probe interface assembly for connecting a circuit tester to a circuit chip, the assembly comprising:
a plurality of parallel electrically conductive planes, and a plurality of electrically insulating planes disposed between the electrically conductive planes;
an array of terminals on a first side of the assembly facing the circuit tester for connection with the circuit tester, and an array of probes on a second side of the assembly facing the circuit chip for connection with the circuit chip;
means for connecting individual ones of said array of terminals with individual ones of said array of probes, said means for connecting including a plurality of vias extending through individual ones of said conductive planes and individual ones of said insulating planes for communicating electrical signals and electric power from said first side to a second side of the assembly;
wherein said plurality of parallel electrically conductive planes includes a set of signal planes comprising strip conductors for conducting electric signals, a set of power planes for conducting electric power, and a set of ground planes;
individual ones of said signal planes are disposed adjacent individual ones of said power planes to form a transmission line with a desired impedance;
individual ones of said ground planes are disposed adjacent individual ones of said power planes to form capacitors with said individual power planes, said set of power planes includes at least one power plane for conduction of electric power at at least one voltage, and each of said insulating planes disposed between a power plane and a ground plane is composed of dielectric material for increasing capacitance of one of said capacitors;
said plurality of vias includes a set of signal vias for conducting electric signals and a set of power vias for conducting electric power, said set of signal vias including at least one signal via group of signal vias for conduction of at least one signal, said set of power vias including at least one power via group of power vias for conduction of electric power at at least one voltage, each signal via group including a plurality of said signal vias and each power via group including a plurality of said power vias;

said connecting means further comprising said set of signal planes and said set of power planes, said signal via groups being connected to respective ones of said set of signal planes and said power via groups being connected to respective ones of said power planes;

wherein in the connection of any one of said signal planes to its signal via group, one signal via connects between the signal plane and one of said array of terminals and a second signal via connects between the signal plane and one of said array of probes;

wherein in the connection of any one of said power planes to its power via group, at least one power via connects between the power plane and at least one of said array of terminals and at least one power via connects between the power plane and at least one of said array of probes;

wherein one of said insulating planes which is disposed between a power plane and an adjacent ground plane is reduced in thickness relative to the thickness of an insulating plane disposed between a signal plane and an adjacent ground plane for increased storage of electrical energy to supply high frequency transient power to a circuit of the chip; and wherein said power planes are located in a portion of the assembly closer to said second side, and said signal planes are located in a portion of said assembly closer to said first side in order to minimize path lengths for conduction of signals from the tester to the chip.

11. An assembly according to claim 10 wherein a power via group comprises a plurality of power vias connecting a plurality of said array of terminals to one of said power planes in order to reduce resistance and inductance in the conduction of current from the first side of the assembly to the power plane.

12. An assembly according to claim 11 further comprising a plurality of capacitors disposed along said second side of said assembly and connected electrically in parallel between a power plane and an adjacent ground plane.

13. An assembly according to claim 10 further comprising a plurality of ground planes disposed between the portion of said assembly containing the power planes and the portion of said assembly containing the signal planes in order to electrically isolate the power planes from the signal planes.

14. A probe interface assembly for connecting a circuit tester to a circuit chip, the assembly comprising:

a plurality of parallel electrically conductive planes, and a plurality of electrically insulating planes disposed between the electrically conductive planes;

an array of terminals on a first side of the assembly facing the circuit tester for connection with the circuit tester, and an array of probes on a second side of the assembly facing the circuit chip for connection with the circuit chip;

means for connecting individual ones of said array of terminals with individual ones of said array of probes, said means for connecting including a plurality of vias extending through individual ones of said conductive planes and individual ones of said insulating planes for communicating electrical signals and electric power from said first side to a second side of the assembly;

wherein said plurality of parallel electrically conductive planes includes a set of signal planes comprising strip conductors for conducting electric signals, a set of power planes for conducting electric power, and a set of ground planes;

individual ones of said signal planes are disposed adjacent individual ones of said power planes to form a transmission line with a desired impedance;

individual ones of said ground planes are disposed adjacent individual ones of said power planes to form capacitors with said individual power planes, said set of power planes includes at least one power plane for conduction of electric power at at least one voltage, and each of said insulating planes disposed between a power plane and a ground plane is composed of dielectric material for increasing capacitance of one of said capacitors;

said plurality of vias includes a set of signal vias for conducting electric signals and a set of power vias for conducting electric power, said set of signal vias including at least one signal via group of signal vias for conduction of at least one signal, said set of power vias including at least one power via group of power vias for conduction of electric power at at least one voltage, each signal via group including a plurality of said signal vias and each power via group including a plurality of said power vias;

said connecting means further comprising said set of signal planes and said set of power planes, said signal via groups being connected to respective ones of said set of signal planes and said power via groups being connected to respective ones of said power planes;

wherein in the connection of any one of said signal planes to its signal via group, one signal via connects between the signal plane and one of said array of terminals and a second signal via connects between the signal plane and one of said array of probes;

wherein in the connection of any one of said power planes to its power via group, at least one power via connects between the power plane and at least one of said array of terminals and at least one power via connects between the power plane and at least one of said array of probes;

wherein one of said insulating planes which is disposed between a power plane and an adjacent ground plane is reduced in thickness relative to the thickness of an insulating plane disposed between a signal plane and an adjacent ground plane for increased storage of electrical energy to supply high frequency transient power to a circuit of the chip; and further comprising a plurality of grounded vias encircling said one signal via.

15. An assembly according to claim 11 wherein, in the connection of any one of said power planes to its power via group, there is a plurality of power vias connecting between the power plane and a plurality of said array of terminals, said plurality of power vias being arranged symmetrically about an axis directed normally to said electrically conductive planes.

16. An assembly according to claim 15 wherein said axis passes through said array of probes on said second side of said assembly.

17. An assembly according to claim 15 wherein, in the connection of any one of said power planes to its power via group, there is a plurality of power vias connecting between the power plane and a plurality of said probes.

18. An assembly according to claim 15 further comprising an outer ring of ground pins adjacent said power vias of a power via group and an inner ring of ground pins adjacent by said power vias of said power via group for shielding one power via group from another power via group.

* * * * *